United States Patent
Takashima et al.

(10) Patent No.: US 8,575,625 B2
(45) Date of Patent: Nov. 5, 2013

(54) SEMICONDUCTOR ELEMENT MOUNTING MEMBER, METHOD OF PRODUCING THE SAME, AND SEMICONDUCTOR DEVICE

(75) Inventors: Kouichi Takashima, Itami (JP); Yoshifumi Aoi, Otsu (JP); Eiji Kamijo, Otsu (JP)

(73) Assignee: A.L.M.T. Corp. (JP)

( * ) Notice: Subject to any disclaimer, the term of this patent is extended or adjusted under 35 U.S.C. 154(b) by 0 days.

(21) Appl. No.: 13/564,426

(22) Filed: Aug. 1, 2012

(65) Prior Publication Data

US 2012/0292769 A1 Nov. 22, 2012

Related U.S. Application Data

(63) Continuation of application No. PCT/JP2011/051925, filed on Jan. 31, 2011.

(30) Foreign Application Priority Data

Feb. 8, 2010 (JP) .................................. 2010-025480

(51) Int. Cl.
*H01L 29/15* (2006.01)

(52) U.S. Cl.
USPC ............. 257/77; 257/751; 257/712; 257/713; 257/E23.072; 438/105; 438/931

(58) Field of Classification Search
USPC ............ 257/751, 77, 712, 713, 720, E23.072; 438/105, 931
See application file for complete search history.

(56) References Cited

U.S. PATENT DOCUMENTS

| | | | |
|---|---|---|---|
| 6,171,691 B1 | 1/2001 | Nishibayashi | |
| 6,270,848 B1 | 8/2001 | Nishibayashi | |
| 6,361,857 B1 * | 3/2002 | Saito et al. | 428/319.1 |
| 7,528,413 B2 * | 5/2009 | Yoshida et al. | 257/77 |
| 2004/0070070 A1 | 4/2004 | Sung | |
| 2004/0070071 A1 | 4/2004 | Sung | |

(Continued)

FOREIGN PATENT DOCUMENTS

| | | |
|---|---|---|
| AT | 7382 U1 | 2/2005 |
| CN | 1703776 A | 11/2005 |

(Continued)

OTHER PUBLICATIONS

International Search Report; Application No. PCT/JP2011/051925; Issued: Apr. 11, 2011; Mailing Date: Apr. 19, 2011; 2 pages.

(Continued)

*Primary Examiner* — Thinh T Nguyen
(74) *Attorney, Agent, or Firm* — St. Onge Steward Johnston & Reens LLC

(57) ABSTRACT

A semiconductor element mounting member is arranged to infiltrate a matrix metal into a porous body that is formed by sintering diamond particles being in direct contact with each other and that has an infiltration auxiliary layer selectively formed only on the exposed surface of each diamond particle. A production method includes a step at which a mixture of diamond particles, a powder of a chemical element out of which the infiltration auxiliary layer is made, and an ammonium chloride powder is compressed and molded, is then heated to 900° C. or more, and is formed into the porous body. A semiconductor device has a semiconductor element mounted on an element mounting surface of the semiconductor element mounting member with a connecting layer therebetween.

14 Claims, 1 Drawing Sheet

(56) References Cited

U.S. PATENT DOCUMENTS

| | | |
|---|---|---|
| 2004/0175875 A1 | 9/2004 | Sung |
| 2004/0253766 A1 | 12/2004 | Sung |
| 2005/0051891 A1 | 3/2005 | Yoshida et al. |
| 2005/0189647 A1 | 9/2005 | Sung |
| 2005/0250250 A1 | 11/2005 | Sung |
| 2006/0091532 A1 | 5/2006 | Sung |
| 2006/0113546 A1 | 6/2006 | Sung |
| 2006/0130998 A1 | 6/2006 | Ludtke |
| 2006/0157884 A1 | 7/2006 | Ludtke et al. |
| 2007/0170581 A1 | 7/2007 | Sung |
| 2007/0298537 A1 | 12/2007 | Sung |
| 2008/0019098 A1 | 1/2008 | Sung |
| 2008/0029883 A1 | 2/2008 | Sung |
| 2008/0157347 A1 | 7/2008 | Takashima |

FOREIGN PATENT DOCUMENTS

| | | | |
|---|---|---|---|
| CN | 1759078 | A | 4/2006 |
| CN | 101212126 | A | 7/2008 |
| EP | 1565938 | A1 | 8/2005 |
| EP | 1601630 | A1 | 12/2005 |
| EP | 1601631 | A1 | 12/2005 |
| EP | 1939993 | A2 | 7/2008 |
| JP | 2069354 | A | 3/1990 |
| JP | 10223812 | A | 8/1998 |
| JP | 11080858 | A | 3/1999 |
| JP | 2006511098 | | 3/2006 |
| JP | 2006524173 | | 10/2006 |
| JP | 2008166579 | A | 7/2008 |
| JP | 2009194241 | A | 8/2009 |
| KR | 1020050084845 | A | 8/2005 |
| WO | 03040420 | A1 | 5/2003 |
| WO | 2004080913 | A1 | 9/2004 |
| WO | 2004080914 | A1 | 9/2004 |
| WO | 2005038912 | A1 | 4/2005 |

OTHER PUBLICATIONS

Hideaki itoh, et al.; "Reaction Sintering Cubic Boron Nitride Using Volatile Catalysts"; Journal of the American Ceramic Society; Dec. 20, 1993; vol. 76, No. 11, pp. 2889-2895.

* cited by examiner

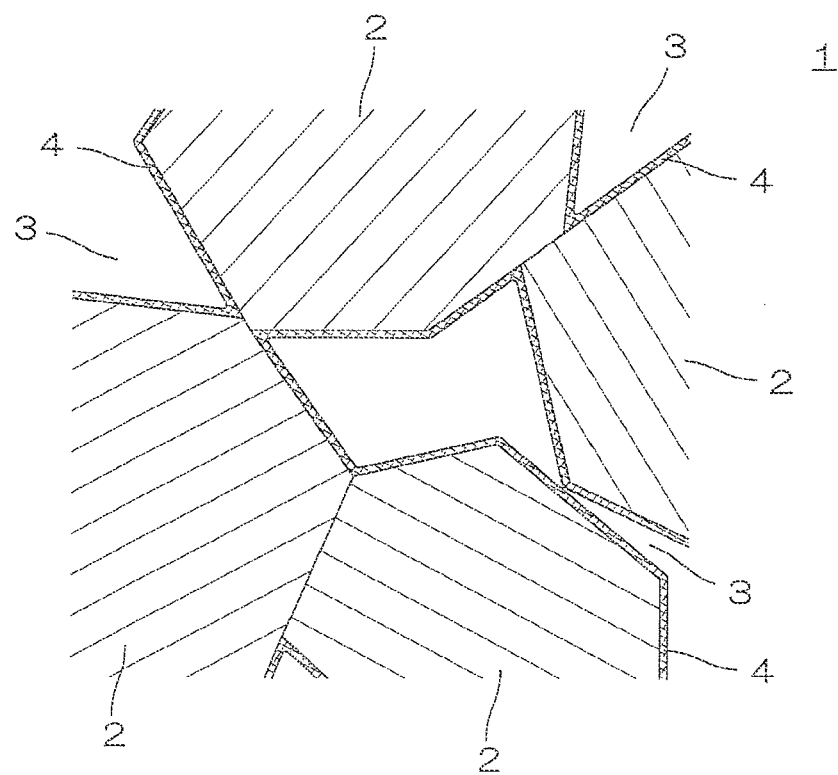

SEMICONDUCTOR ELEMENT MOUNTING MEMBER, METHOD OF PRODUCING THE SAME, AND SEMICONDUCTOR DEVICE

CROSS-REFERENCE TO RELATED APPLICATIONS

The present application is a continuation of pending International patent application PCT/JP2011/051925 filed on Jan. 31, 2011 which designates the United States and claims priority from Japanese patent application 2010-025480 filed on Feb. 8, 2010, the content of which is incorporated herein by reference.

FIELD OF THE INVENTION

The present invention relates to a semiconductor element mounting member that consists of a diamond-metal complex including many diamond particles and a matrix metal and that has an element mounting surface on which a semiconductor element is mounted, relates to a method of producing the semiconductor element mounting member, and relates to a semiconductor device that uses the semiconductor element mounting member.

BACKGROUND OF THE INVENTION

A semiconductor-element mounting member (e.g., a submount, a heat spreader, a heat sink, or a housing) which has an element mounting surface on which a semiconductor element, such as a light emitting diode or a semiconductor laser, is mounted and used is required to have a high thermal conductivity.

Heat generated during the operation of the semiconductor element can be promptly removed through the semiconductor element mounting member by giving such a high thermal conductivity to the semiconductor element mounting member. Therefore, the semiconductor element can be prevented from making a malfunction caused by heat, or from lowering its operation efficiency and its lifetime, or from being damaged.

Conventionally, the semiconductor element mounting member has been generally made of ceramic such as AlN or SiC. However, in recent years, with the heightening of the output capability of the semiconductor element, the semiconductor element mounting member has been required to have an even higher thermal conductivity.

In order to fulfill this requirement, in recent years, a semiconductor element mounting member that consists of a diamond-metal complex including many fine diamond particles and a matrix metal has been developed. Diamond has the highest thermal conductivity of all substances, and therefore the thermal conductivity of the semiconductor element mounting member is expected to be made enormously higher than conventional ones made of ceramic or the like by forming the semiconductor element mounting member by use of the diamond-metal complex.

For example, Published PCT International Application No. WO03/040420 ("Patent Document 1") discloses a production method mentioned below according to which a semiconductor element mounting member that consists of a diamond-metal complex is produced.

A mixture of diamond particles each of which has a particle diameter of from 5 μm to 100 μm, a Cu powder, and a Group IVa (Ti, Zr, Hf) or Group Va (V, Nb, Ta) metal powder is enclosed in a metallic capsule in a vacuum or in an inert atmosphere.

Thereafter, the metallic capsule is subjected to heat treatment and pressure treatment under a high-temperature/extra-high-pressure condition under which the pressure ranges from 1 GPa to 6 GPa, and the temperature ranges from 1100° C. to 1500° C.

As a result of the heat treatment and the pressure treatment, the many diamond particles are connected together by means of Cu that has been forcibly infiltrated between the diamond particles. In this case, the mixture mixing ratio and the high-temperature/extra-high-pressure condition are set so that at least several diamond particles are kept in direct contact with each other.

Thereafter, the metallic capsule is removed by, for example, grinding, and then a precursor of a semiconductor element mounting member that consists of the diamond-metal complex is obtained, and the resulting precursor is subjected to electric discharge machining if necessary, thus producing a semiconductor element mounting member that has a predetermined three-dimensional shape.

However, in this production method, special manufacturing facilities that can create the high-temperature/extra-high-pressure condition are needed, and therefore the restriction of the manufacturing facilities imposes inevitable limitations on the size of a producible semiconductor-element mounting member. In a state of the precursor that has not yet been subjected to, for example, electric discharge machining, the limit of its size is about diameter 70φ×thickness 5 mm.

Additionally, the heat treatment and the pressure treatment are performed according to so-called batch processing, and require much time for one-time processing, and consume enormous energy, and therefore the productivity of the semiconductor element mounting member is remarkably low.

Additionally, large-scale manufacturing facilities are needed in comparison with the size of a precursor that can be formed, and, as a result, disadvantageously, production costs of the semiconductor element mounting member become high.

Japanese Published Unexamined Patent Application No. H10-223812 ("Patent Document 2") discloses a production method mentioned below according to which a diamond-metal complex is produced.

In a state in which a container is filled with many diamond particles each of which has a particle diameter of from 60 μm to 700 μm, Groups 4A to 7A metals, such as Ti, Zr, and Hf, are infiltrated, and a layer made of carbide of the metals is formed on the surface of the diamond particles.

Thereafter, Cu, Ag, Au, Al, etc., are further infiltrated into gaps between the many diamond particles so as to function as a joining material, thereby joining the many diamond particles together.

Japanese Published Unexamined Patent Application No. H11-80858 ("Patent Document 3") discloses a production method mentioned below according to which a carbon-metal complex is produced.

The surface of a dispersing agent made of carbon and/or graphite is coated with a covering layer made of one or more elements, such as Cr, Fe, or Mo, by means of, for example, PVD, CVD, or plating.

Thereafter, the dispersing agent and a matrix metal (joining material) that is made of Cu or a Cu alloy are combined together.

In this production method, a diamond-metal complex can be formed by using diamond particles serving as a dispersing agent.

Both the carbide layer of Patent Document 2 and the covering layer of Patent Document 3 serve to improve the wettability of a melt of a metal, such as Cu, that is used as a joining material with respect to diamond particles. In other words, each of these layers functions as an infiltration auxiliary layer that assists the infiltration of the metal and the combination with the diamond particles.

Therefore, the infiltration step can be performed in a vacuum or in an inert atmosphere under approximately normal pressure, and large-scale manufacturing facilities and the like are not required to be used for creating the high-temperature/extra-high-pressure condition of Patent Document 1.

Therefore, limitations imposed on the size of a producible composite material can be substantially eliminated.

Moreover, the covering-layer coating process, as well as the infiltrating process, can be performed in a shorter time and with enormously less consumption energy than the heat treatment and the pressure treatment under the high-temperature/extra-high-pressure condition.

Especially the infiltration step can be continuously performed by use of, for example, a belt furnace.

Therefore, according to the production methods of Patent Documents 2 and 3, advantageously, the semiconductor element mounting member can be produced with extremely excellent productivity and at extremely low cost.

However, a problem resides in the fact that, although the semiconductor element mounting member that is produced through the infiltration step of each of Patent Documents 2 and 3 is formed by use of diamond particles, the semiconductor element mounting member cannot obtain a high thermal conductivity resulting from the use of diamond particles.

The cause is that the infiltration auxiliary layer formed on substantially the whole of the surface of diamond particles hinders the diamond particles from coming into direct contact with each other, and hence brings about a decrease in thermal conductivity between the diamond particles.

Another problem resides in the fact that the number of process steps is increased, and the productivity of the semiconductor element mounting member is lowered in accordance with the necessity of the process of forming the infiltration auxiliary layer on the diamond-particle surface.

SUMMARY OF THE INVENTION

It is an object of the present invention to provide a semiconductor element mounting member that has a high thermal conductivity meeting the fact of being formed by use of diamond particles and that is capable of arbitrarily enlarging its size without undergoing the restriction of, for example, manufacturing facilities.

It is another object of the present invention to provide a method of producing the semiconductor element mounting member efficiently at a low cost without using large-scale manufacturing facilities.

It is still another object of the present invention to provide a semiconductor device that is capable of promptly removing heat generated during the operation of a semiconductor element by using the semiconductor element mounting member and that is capable of reliably preventing the semiconductor element from making a malfunction caused by heat, or from lowering its operation efficiency and its lifetime, or from being damaged.

The present invention is a semiconductor element mounting member having an element mounting surface on which a semiconductor element is to be mounted, consisting of a diamond-metal complex in which at least one kind of matrix metal selected from the group consisting of Cu, Ag, and Al is infiltrated into a porous body consisting of many diamond particles characterized in that the porous body is formed by sintering the many diamond particles directly contacted each other, and the infiltration auxiliary layer made of at least one kind of chemical element selected from the group consisting of Cr, W, Mo, Si, Ti, and Ni is formed on an exposed surface of each of the many diamond particles.

As described above, in order to give a high thermal conductivity that meets the formation by use of diamond particles to the semiconductor element mounting member, many diamond particles are required to come into direct contact with each other in the diamond-metal complex.

However, if the infiltration auxiliary layer is not formed on the surface of each diamond particle in order to bring the diamond particles into direct contact with each other, the wettability of a melt of the matrix metal that functions as a joining material with respect to the diamond particles will become insufficient. Therefore, even if the infiltration step is performed, the melt cannot be evenly infiltrated into the aggregate of the diamond particles without gaps.

Therefore, disadvantageously, a semiconductor element mounting member that has sufficient strength cannot be obtained, and, in addition, the heat conduction is hindered by bubbles that remain inside, so that the thermal conductivity of the semiconductor element mounting member is lowered.

On the other hand, the semiconductor element mounting member of the present invention consists of a porous body obtained by sintering many diamond particles in a state in which the diamond particles are in direct contact with each other as described above, and therefore high heat conduction between the diamond particles can be secured by this direct contact.

Additionally, the infiltration auxiliary layer selectively formed only on the exposed surface of each diamond particle making up the porous body functions to improve the wettability of the melt of the matrix metal. Therefore, when the infiltration step is performed, the melt can be evenly infiltrated into the porous body without gaps.

Therefore, bubbles can be restrained from remaining, and, as described above, the thermal conductivity of the semiconductor element mounting member can be greatly improved in cooperation with the fact that diamond particles can come into direct contact with each other. Additionally, the strength of the semiconductor element mounting member can also be improved.

Still additionally, the semiconductor element mounting member of the present invention can be produced through an ordinary infiltration step as described above, and is not required to use special manufacturing facilities that create high-temperature/extra-high-pressure conditions mentioned above, and therefore its size can be arbitrarily enlarged without undergoing the restriction of such manufacturing facilities.

In detail, it becomes possible to produce a large-sized semiconductor element mounting member having the dimensions of, for example, 150 mm or more in length×150 mm or more in width×6 mm or more in thickness and a diamond-metal complex serving as its precursor.

In the semiconductor element mounting member of the present invention, the thermal conductivity of the diamond-metal complex out of which the semiconductor element mounting member is made is preferably 150 W/m·K or more, and is more preferably 280 W/m·K or more.

Accordingly, even if the semiconductor element that is mounted on the element mounting surface is arranged to have an even higher output capability in the future, heat generated during the operation of the semiconductor element can be promptly removed, and the semiconductor element can be reliably prevented from making a malfunction caused by heat, or from lowering its operation efficiency and its lifetime, or from being damaged.

Additionally, in the semiconductor element mounting member of the present invention, the mean diameter of the diamond particles forming the diamond-metal complex is preferably 1 µm or more.

If fine diamond particles of less than 1 µm in mean particle diameter are used, the number of interfaces at which the diamond particles come into contact with each other will greatly rise. The diamond particles are in direct contact with each other at the interfaces, and therefore a higher thermal conductivity can be secured than in an example in which an infiltration auxiliary layer is provided as an interposition. However, the thermal conductivity at the interfaces is not satisfactorily higher after all than that of the diamond particles themselves.

Therefore, the thermal conductivity of the diamond-metal complex and hence the thermal conductivity of the semiconductor element mounting member tend to become lower in proportion to a rise in the number of the interfaces.

On the other hand, if diamond particles of 1 µm or more in mean particle diameter are used, the number of the interfaces can be made as small as possible, and the thermal conductivity of the diamond-metal complex and hence the thermal conductivity of the semiconductor element mounting member can be made even higher.

In the semiconductor element mounting member of the present invention, the thickness of the infiltration auxiliary layer is preferably 5 µm or less.

If the thickness of the infiltration auxiliary layer exceeds 5 µm, the percentage of the infiltration auxiliary layer with respect to the whole of the semiconductor element mounting member will become high. Additionally, the cross-sectional area of the thermal conduction path arranged by the matrix metal infiltrated into the pores of the porous body is decreased in proportion to the thickness of the infiltration auxiliary layer.

Still additionally, at least one kind of chemical element selected from the group consisting of Cr, W, Mo, Si, Ti, and Ni that forms an infiltration auxiliary layer has a lower thermal conductivity than diamond particles or than at least one kind of matrix metal selected from the group consisting of Cu, Ag, and Al.

Therefore, the thermal conductivity of the diamond-metal complex and hence the thermal conductivity of the semiconductor element mounting member tend to become low.

On the other hand, if the thickness of the infiltration auxiliary layer is set to be 5 µm or less, the percentage of the infiltration auxiliary layer with respect thereto can be reduced, and the cross-sectional area of the thermal conduction path arranged by the matrix metal can be enlarged. Therefore, the thermal conductivity of the diamond-metal complex and hence the thermal conductivity of the semiconductor element mounting member can be further raised.

Additionally, in the semiconductor element mounting member of the present invention, the content percentage of at least one kind of chemical element selected from the group consisting of Cr, W, Mo, Si, Ti, and Ni that forms the infiltration auxiliary layer is preferably 20 volume % or less of the total amount of the chemical element and the diamond particles. The reason is the same as above.

In other words, if the content percentage of the chemical element exceeds 20 volume %, the percentage of the infiltration auxiliary layer having a low thermal conductivity with respect to the whole of the semiconductor element mounting member will become high. Additionally, the cross-sectional area of the thermal conduction path arranged by the matrix metal infiltrated into the pores of the porous body is decreased in proportion to the thickness of the infiltration auxiliary layer.

Therefore, the thermal conductivity of the diamond-metal complex and hence the thermal conductivity of the semiconductor element mounting member tend to become low.

On the other hand, if the content percentage of the chemical element forming the infiltration auxiliary layer is 20 volume % or less, the percentage of the infiltration auxiliary layer with respect to the whole of the semiconductor element mounting member can be reduced, and the cross-sectional area of the thermal conduction path arranged by the matrix metal can be enlarged. Therefore, the thermal conductivity of the diamond-metal complex and hence the thermal conductivity of the semiconductor element mounting member can be further raised.

Preferably, in the semiconductor element mounting member of the present invention, a connecting layer made of solder containing at least one kind of metal selected from the group consisting of In, Sn, Ag, Au, Ge, Si, and Al is formed on the element mounting surface.

As a result, the semiconductor element mounting member and the semiconductor element are connected together in a state of closely adhering thereto through the connecting layer, and heat generated during the operation of the semiconductor element can be promptly removed.

Therefore, the semiconductor element can be even more reliably prevented from making a malfunction caused by heat, or from lowering its operation efficiency and its lifetime, or from being damaged.

Preferably, in the semiconductor element mounting member of the present invention, an adhesion layer made of at least one kind of metal selected from the group consisting of Ni, Au, Ti, and Cr or made of a compound of these metals is interposed between the element mounting surface and the connecting layer.

The interposition of the adhesion layer makes it possible to heighten the adhesiveness between the semiconductor element mounting member and the connecting layer and to heighten the connecting strength of the semiconductor element.

Preferably, in the semiconductor element mounting member of the present invention, a diffusion preventing layer made of at least one kind of metal selected from the group consisting of Pt, Mo, and Pd or made of a compound of these metals is interposed between the adhesion layer and the connecting layer.

The interposition of the diffusion preventing layer makes it possible to prevent the composition of the connecting layer from being changed in quality by the diffusion of the metal from the adhesion layer when the connecting layer is melted by heat generated when the semiconductor element is mounted on the element mounting surface.

The present invention is a production method of producing the semiconductor element mounting member, and is characterized by including, (1) a step of mixing many diamond particles out of which a porous body is made with at least either one selected from the group consisting of (1-1) a powder of at least one kind of chemical element selected from the group consisting of Cr, W, Mo, Si, Ti, and Ni, and a powder of ammonium halide, and (1-2) a powder of halide of at least one kind of chemical element selected from the group consisting of Cr, W, Mo, Si, Ti, and Ni, and then preparing a resulting mixture;

(2) a step of compressing and molding the mixture and producing a compression-molded compact;

(3) a step of heating the compression-molded compact to 900° C. or more in a non-oxidizing atmosphere, then sintering the many diamond particles in a state of being in direct contact with each other, and forming an infiltration auxiliary layer made of the chemical element on an exposed surface of each diamond particle; and (4) a step of infiltrating a matrix metal into the porous body.

If the mixture prepared at the step (1) is a mixture of diamond particles and the two kinds of powders of (1-1) in the production method of the present invention, a reaction shown by the following formula (a) proceeds when a compression-molded compact produced through the step (2) is heated to 900° C. or more in a non-oxidizing atmosphere at the step (3).

$$n\text{NH}_4\text{X} + \text{M} \rightarrow \text{MX}_n\uparrow + 0.5n\text{N}_2 + 2n\text{H}_2 \quad (a)$$

[In the formula, M designates at least one kind of chemical element selected from the group consisting of Cr, W, Mo, Si, Ti, and Ni, and n designates the valence number of the chemical element M, and X designates a halogen element.]

In detail, a halide $MX_n$ of the chemical element M is generated, and the halide $MX_n$ is vaporized. Thereafter, the diamond particles are sintered in a state in which the diamond particles are in direct contact with each other in an atmosphere that is filled with gas of the vaporized halide $MX_n$, and, as a result, a porous body is formed.

Thereafter, it is cooled, and a reduction reaction shown by the following formula (b) proceeds during the cooling process.

$$\text{MX}_n + 0.5n\text{H}_2 \rightarrow \text{M}\downarrow + n\text{HX} \quad (b)$$

[M, n, and X in the formula are the same as above.]

In detail, the reduction reaction proceeds, and the halide $MX_n$ is decomposed, and, as a result, the chemical element M is selectively deposited on the exposed surface of each diamond particle making up the porous body that has undergone the sintering process, so that an infiltration auxiliary layer is formed.

If the mixture prepared at the step (1) is a mixture of diamond particles and the halide $MX_n$ of (1-2), the halide $MX_n$ is vaporized by heating at the step (3). Thereafter, the process proceeds in the same way as above.

In detail, the diamond particles are sintered in a state in which the diamond particles are in direct contact with each other in an atmosphere that is filled with gas of the vaporized halide $MX_n$, and, as a result, a porous body is formed.

Thereafter, the reduction reaction of the formula (b) proceeds during the cooling process, and the halide $MX_n$ is decomposed, and, as a result, the chemical element M is selectively deposited on the exposed surface of each diamond particle making up the porous body that has undergone the sintering process, so that an infiltration auxiliary layer is formed.

The mixture prepared at the step (1) may be a mixture of diamond particles, a powder of the chemical element M, a powder of the ammonium halide, and a powder of the halide $MX_n$.

If this mixture is used, the halide $MX_n$ is vaporized by heating at the step (3), and the powder of the chemical element M and the powder of the ammonium halide cause the reaction of the formula (a), so that a halide $MX_n$ is generated, and the resulting halide $MX_n$ is vaporized. Thereafter, the process proceeds in the same way as above.

In detail, the diamond particles are sintered in a state in which the diamond particles are in direct contact with each other in an atmosphere that is filled with gas of the vaporized halide $MX_n$, and, as a result, a porous body is formed.

Thereafter, the reduction reaction of the formula (b) proceeds during the cooling process, and the halide $MX_n$ is decomposed, and, as a result, the chemical element M is selectively deposited on the exposed surface of each diamond particle making up the porous body that has undergone the sintering process, so that an infiltration auxiliary layer is formed.

The halide $MX_n$ can be used as a material of the mixture only in a case in which the halide can be stably present in the form of a solid especially at a normal temperature in a working environment in which the mixture is prepared.

For example, if the halide $MX_n$ is a chloride $MCl_n$, it is limited to at least one kind of compound selected from the group consisting of $CrCl_2$, $WCl_4$, $MoCl_2$, $MoCl_3$, $TiCl_3$, and $NiCl_2$.

Only in this case, a mixture can be prepared in such a way that a halide powder is mixed with diamond particles at a predetermined ratio or in such a way that a halide powder is mixed with diamond particles at a predetermined ratio together with a chemical-element powder and an ammonium-halide powder.

Thereafter, when the infiltration of the step (4) is performed, the melt of the matrix metal can be evenly infiltrated into the porous body without gaps and without generating bubbles or the like inside by the function of the previously-formed infiltration auxiliary layer.

All of the steps mentioned above can be performed under nearly normal pressure by use of general-purpose equipment under ordinary conditions, and there is no need to use the above-mentioned special manufacturing facilities that create high-temperature/extra-high-pressure conditions. Therefore, the size of the semiconductor element mounting member can be arbitrarily enlarged without undergoing the restriction of, for example, the manufacturing facilities.

Additionally, each step can be performed in a shorter time and with extremely less consumption energy than the heat/pressure treatment under the high-temperature/extra-high-pressure conditions. The infiltration step especially can be continuously performed by using a belt furnace or the like.

Additionally, according to the present invention, as is clear from the reaction mechanism, a step of forming an infiltration auxiliary layer is not required to be newly provided, and therefore the semiconductor element mounting member can be produced with extremely excellent productivity and at an extremely low cost.

Preferably, the mixing ratio between the chemical element M and the halogen X at the step (1) of the production method of the present invention is 1/2 or less that is expressed as the atomic ratio M/X.

If the halogen is smaller than the above-mentioned range, it is vaporized as a halide $MX_n$ during heating at the step (3), and is then deposited by cooling, so that the amount of the chemical element M forming the infiltration auxiliary layer becomes insufficient, and unevenness tends to occur in the thickness of the infiltration auxiliary layer.

Therefore, bubbles tend to be generated when the melt of the matrix metal is infiltrated into the porous body, and there is a fear that the thermal conductivity of the diamond-metal complex and hence the thermal conductivity of the semiconductor element mounting member will become low.

On the other hand, if the atomic ratio M/X is set to be 1/2 or less, the infiltration auxiliary layer can be formed to have a uniform thickness without unevenness.

Therefore, the melt of the matrix metal can be evenly infiltrated into the porous body without generating bubbles or the like, and the thermal conductivity of the diamond-metal complex and hence the thermal conductivity of the semiconductor element mounting member can be further raised.

The present invention is a semiconductor device characterized in that a connecting layer made of solder containing at least one kind of metal selected from the group consisting of In, Sn, Ag, Au, Ge, Si, and Al is formed on the element mounting surface of the semiconductor element mounting member according to any one of claim 1 to claim 9, and a semiconductor element is mounted on the element mounting surface with the connecting layer therebetween.

According to the semiconductor device of the present invention, the semiconductor element mounting member and the semiconductor element can be connected together in a state of closely adhering thereto through the connecting layer. Therefore, heat generated during the operation of the semiconductor element can be promptly removed, and the semiconductor element can be reliably prevented from making a malfunction caused by heat, or from lowering its operation efficiency and its lifetime, or from being damaged.

Preferably, in the semiconductor device of the present invention, an adhesion layer made of at least one kind of metal selected from the group consisting of Ni, Au, Ti, and Cr or made of a compound of these metals is interposed between the element mounting surface and the connecting layer.

The interposition of the adhesion layer makes it possible to heighten the adhesiveness between the semiconductor element mounting member and the connecting layer and to heighten the connecting strength of the semiconductor element.

Preferably, in the semiconductor element of the present invention, a diffusion preventing layer made of at least one kind of metal selected from the group consisting of Pt, Mo, and Pd or made of a compound of these metals is interposed between the adhesion layer and the connecting layer.

The interposition of the diffusion preventing layer makes it possible to prevent the composition of the connecting layer from being changed in quality by the diffusion of the metal from the adhesion layer when the connecting layer is melted by heat generated when the semiconductor element is mounted on the element mounting surface.

According to the present invention, it is possible to provide a semiconductor element mounting member that has a high thermal conductivity meeting the fact of being formed by use of diamond particles and that is capable of arbitrarily enlarging its size without undergoing the restriction of, for example, manufacturing facilities.

Additionally, according to the present invention, it is possible to provide a method of producing the semiconductor element mounting member efficiently at a low cost without using large-scale manufacturing facilities.

Additionally, according to the present invention, the use of the semiconductor element mounting member makes it possible to provide a semiconductor device that is capable of promptly removing heat generated during the operation of a semiconductor element and that is capable of reliably preventing the semiconductor element from making a malfunction caused by heat, or from lowering its operation efficiency and its lifetime, or from being damaged.

BRIEF DESCRIPTION OF THE DRAWING

FIG. 1 is an enlarged sectional view of a part of a porous body out of which a semiconductor element mounting member of the present invention is made.

DETAILED DESCRIPTION OF THE INVENTION

<Semiconductor Element Mounting Member>

The semiconductor element mounting member of the present invention consists of a diamond-metal complex in which at least one kind of matrix metal selected from the group consisting of Cu, Ag, and Al is infiltrated into a porous body consisting of many diamond particles, and the semiconductor element mounting member has an element mounting surface on which a semiconductor element is to be mounted.

With reference to FIG. 1, the porous body 1 is formed by sintering the many diamond particles 2 in a state in which the diamond particles 2 are in direct contact with each other.

An infiltration auxiliary layer 4 made of at least one kind of chemical element selected from the group consisting of Cr, W, Mo, Si, Ti, and Ni is formed on a surface of each diamond particle 2 exposed to pores 3 of the porous body 1 or exposed to an outer surface (not shown).

The semiconductor element mounting member of the present invention is formed by infiltrating a matrix metal (not shown) into the pores 3. In this case, as described above, a melt of the matrix metal can be evenly infiltrated into the porous body without gaps by the function of the infiltration auxiliary layer 4.

Therefore, bubbles can be restrained from remaining, and the thermal conductivity of the semiconductor element mounting member can be greatly improved in cooperation with the capability of bringing the diamond particles 2 into direct contact with each other as described above. Additionally, the strength of the semiconductor element mounting member can be improved.

As a specific example of the semiconductor element mounting member of the present invention, it is possible to mention a submount, a heat spreader, a heat sink, or a housing that were shaped like a flat plate as a whole and that has its one surface serving as the element mounting surface and its opposite surface serving as a connection surface connected to another member, such as a heat sink, respectively.

Natural or artificial diamond particles are used as the diamond particles out of which the semiconductor element mounting member of the present invention is made. Preferably, the diamond particle has a mean particle diameter of 1 μm or more.

If fine diamond particles of less than 1 μm in mean particle diameter are used, the number of interfaces at which the diamond particles come into contact with each other will greatly rise. The diamond particles are in direct contact with each other at the interfaces, and therefore a higher thermal conductivity can be secured than in an example in which an infiltration auxiliary layer is provided as an interposition. However, the thermal conductivity at the interfaces is not satisfactorily higher after all than that of the diamond particles themselves.

Therefore, the thermal conductivity of a diamond-metal complex and hence the thermal conductivity of the semiconductor element mounting member tend to become lower in proportion to a rise in the number of the interfaces.

On the other hand, if diamond particles of more than 1 μm in mean particle diameter are used, the number of the interfaces can be made as small as possible, and the thermal conductivity of the diamond-metal complex and hence the thermal conductivity of the semiconductor element mounting member can be made even higher.

Preferably, the mean particle diameter of the diamond particles is 200 μm or less.

If large diamond particles of more than 200 μm in mean particle diameter are used, it will become difficult to perform machining by which the diamond-metal complex is formed into a predetermined three-dimensional shape of the semiconductor element mounting member or by which the element mounting surface and the connection surface are each finished into a predetermined plane state.

Moreover, there is a fear that diamond particles having large particle diameters will be dropped off during the machining, and, as a result, a major defect by which heat conduction is obstructed in the connecting to, for example, a semiconductor element will occur in the element mounting surface.

Preferably, the mean particle diameter of the diamond particles is 10 μm or more within the above-mentioned range in consideration of the fact that the thermal conductivity of the semiconductor element mounting member is further improved by making the number of the interfaces between the diamond particles as small as possible.

Additionally, preferably, the mean particle diameter of the diamond particles is 50 μm or less within the above-mentioned range in consideration of the fact that machining is further facilitated or the fact that a major defect is even more reliably prevented from occurring in, for example, the element mounting surface.

As described above, the infiltration auxiliary layer is made of at least one kind of chemical element selected from the group consisting of Cr, W, Mo, Si, Ti, and Ni.

Preferably, the thickness of the infiltration auxiliary layer is 5 μm or less.

If the thickness thereof exceeds the above-mentioned range, the percentage of the infiltration auxiliary layer, which is lower in thermal conductivity than the diamond particles or the matrix metal, with respect to the whole of the semiconductor element mounting member will become great. Additionally, the cross-sectional area of a thermal conduction path arranged by a matrix metal infiltrated into the pores of the porous body is decreased in proportion to the thickness of the infiltration auxiliary layer.

Therefore, the thermal conductivity of the diamond-metal complex and hence the thermal conductivity of the semiconductor element mounting member tend to become low.

On the other hand, if the thickness of the infiltration auxiliary layer is below the above-mentioned range, the percentage of the infiltration auxiliary layer with respect thereto can be reduced, and the cross-sectional area of the thermal conduction path arranged by the matrix metal can be enlarged. Therefore, the thermal conductivity of the diamond-metal complex and hence the thermal conductivity of the semiconductor element mounting member can be further raised.

Preferably, the thickness of the infiltration auxiliary layer is 0.01 μm or more. If the thickness thereof is less than 0.01 μm, the function to assist the infiltration of a matrix metal that is fulfilled by the infiltration auxiliary layer cannot be sufficiently obtained. Therefore, bubbles tend to be generated when the melt of the matrix metal is infiltrated into the porous body, and there is a fear that the thermal conductivity of the diamond-metal complex and hence the thermal conductivity of the semiconductor element mounting member will become low.

Preferably, the thickness of the infiltration auxiliary layer is 2.5 μm or less within the above-mentioned range in consideration of improving the thermal conductivity of the semiconductor element mounting member by making the percentage of the infiltration auxiliary layer with respect thereto even smaller and by making the cross-sectional area of the thermal conduction path arranged by the matrix metal even greater.

In order to adjust the thickness of the infiltration auxiliary layer, for example, in the production method of the present invention described later, it is recommended to appropriately change the following, i.e., the mixing ratio of a powder of the chemical element or of a powder of halide of the chemical element with respect to the diamond particles, the atomic ratio M/X between the chemical element M and halogen X, the mean particle diameter of the diamond particles, the compression molding condition (e.g., molding pressure) at step (2), or the heating condition at step (3).

Preferably, the content percentage of the chemical element forming the infiltration auxiliary layer is 20 volume % or less of the total amount of the chemical element and the diamond particles.

If the content percentage thereof exceeds 20 volume %, the percentage of the infiltration auxiliary layer having a low thermal conductivity with respect to the whole of the semiconductor element mounting member will become high. Additionally, the cross-sectional area of the thermal conduction path arranged by the matrix metal infiltrated into the pores of the porous body is decreased in proportion to the thickness of the infiltration auxiliary layer.

Therefore, the thermal conductivity of the diamond-metal complex and hence the thermal conductivity of the semiconductor element mounting member tend to become low.

On the other hand, if the content percentage of the chemical element forming the infiltration auxiliary layer is 20 volume % or less of the total amount of the chemical element and the diamond particles, the percentage of the infiltration auxiliary layer with respect to the whole of the semiconductor element mounting member can be reduced, and the cross-sectional area of the thermal conduction path arranged by the matrix metal can be enlarged. Therefore, the thermal conductivity of the diamond-metal complex and hence the thermal conductivity of the semiconductor element mounting member can be further raised.

Preferably, the content percentage of the chemical element is 0.1 volume % or more.

If the content percentage thereof is less than 0.1 volume %, the thickness of the infiltration auxiliary layer that is formed on the surface of each diamond particle making up the porous body and that is made of the above-mentioned chemical element becomes insufficient, thus making it impossible to satisfactorily serve as the infiltration auxiliary layer.

Therefore, bubbles tend to be generated when the melt of the matrix metal is infiltrated into the porous body, and there is a fear that the thermal conductivity of the diamond-metal complex and hence the thermal conductivity of the semiconductor element mounting member will become low.

Preferably, the percentage of the chemical element is 7 volume % or less in the above-mentioned range in consideration of improving the thermal conductivity of the semiconductor element mounting member by further reducing the percentage of the infiltration auxiliary layer and by further enlarging the cross-sectional area of the thermal conduction path arranged by the matrix metal.

In order to adjust the content percentage of the chemical element, it is recommended to appropriately change the mixing ratio of a powder of the chemical element with respect to the diamond particles or the mixing ratio of a powder of halide of the chemical element with respect thereto in the production method of the present invention described later.

At least one kind of chemical element selected from the group consisting of Cu, Ag, and Al can be mentioned as the matrix metal.

The content percentage of the matrix metal is preferably 20 volume % or more of the total amount of the diamond-metal complex, especially, 30 volume % or more, and is preferably 80 volume % or less, especially 60 volume % or less.

If the content percentage of the matrix metal is less than the above-mentioned range, pores in the porous body cannot be closely and evenly infiltrated with the matrix metal, and bubbles remain in the porous body, and, as a result, there is a fear that the thermal conductivity of the diamond-metal complex and hence the thermal conductivity of the semiconductor element mounting member will become low.

On the other hand, if the content percentage of the matrix metal exceeds the above-mentioned range, an excessive matrix metal will lie between the diamond particles, and will hinder the diamond particles from coming into direct contact with each other, and, as a result, disadvantageously, there is a fear that the thermal conductivity of the diamond-metal complex and hence the thermal conductivity of the semiconductor element mounting member will become low.

In order to adjust the percentage of the matrix metal, it is recommended to appropriately change the following, i.e., the mean particle diameter of the diamond particles, the porosity rate of the porous body made of the diamond particles, or the thickness of the infiltration auxiliary layer formed on an exposed surface of each diamond particle making up the porous body.

In order to adjust the porosity rate of the porous body, it is recommended to appropriately change a compression molding condition described later and the like.

The thermal conductivity of a diamond-metal complex out of which the semiconductor element mounting member of the present invention is made is preferably 150 W/m·K or more, and more preferably 280 W/m·K or more.

Accordingly, even if the semiconductor element that is mounted on the element mounting surface is arranged to have an even higher output capability in the future, heat generated during its operation can be promptly removed, and the semiconductor element can be reliably prevented from making a malfunction caused by heat, or from lowering its operation efficiency and its lifetime, or from being damaged.

Preferably, the thermal conductivity of the diamond-metal complex is 650 W/m·K or less.

The thermal conductivity can be adjusted by appropriately changing kinds and respective percentages of the diamond particles, the matrix metal, and the chemical element forming the infiltration auxiliary layer, the mean particle diameter of the diamond particles, the thickness of the infiltration auxiliary layer, etc. However, in the structure of the present invention including the matrix metal, it is substantially difficult to form a diamond-metal complex having a high thermal conductivity that exceeds 650 W/m·K.

The semiconductor element mounting member of the present invention has the element mounting surface and the connection surface each of which has a surface roughness of preferably 0.2 μm or more, and preferably 1.6 μm or less, especially 0.9 μm or less, which are each represented by an arithmetic mean roughness Ra of a roughness curve specified by Japan Industrial Standard JIS B0601: 2001 "Geometric Product Specification (GPS)—Surface Design: Contour Curve Method—Term, Definition, and Surface Design Parameter."

Much time and effort are required to grind and finish the element mounting surface and the connection surface so that these surfaces become smooth, and, unfortunately, the surface roughness Ra of each surface tends to become great because of, for example, the fall of diamond particles during grinding. Therefore, it is substantially difficult to finish the element mounting surface or the like into a smooth surface whose surface roughness is less than the above-mentioned range.

On the other hand, if the surface roughness exceeds the above-mentioned range, it will not be easy to connect a semiconductor element to, for example, the element mounting surface through a connecting layer or the like (described later) in a state in which the semiconductor element closely adheres thereto, and there is a case in which heat generated during the operation of the semiconductor element cannot be promptly removed.

Therefore, there is a fear that the semiconductor element cannot be reliably prevented from making a malfunction caused by heat, or from lowering its operation efficiency and its lifetime, or from being damaged.

The diamond-metal complex forming the semiconductor element mounting member of the present invention has a thermal expansion coefficient of preferably $2 \times 10^{-6}$/K or more, especially $4 \times 10^{-6}$/K or more, and has a thermal expansion coefficient of preferably $10 \times 10^{-6}$/K or less, especially $8 \times 10^{-6}$/K or less.

A difference in the thermal expansion coefficient between the diamond-metal complex and the semiconductor element (especially, GaAs-based or GaN-based semiconductor element) that is mounted on the element mounting surface can be reduced, and matchability can be heightened by setting the thermal expansion coefficient of the diamond-metal complex to fall within the above-mentioned range.

Therefore, when the semiconductor element is mounted on the element mounting surface or when the semiconductor element is operated, the application of an excessive stress onto the semiconductor element is prevented based on the difference in the thermal expansion coefficient, and therefore the semiconductor element can be prevented from being damaged, or from reducing its operation efficiency and its lifetime, or from being disconnected.

In order to adjust the thermal expansion coefficient, it is recommended to appropriately change kinds and respective percentages of the diamond particles, the matrix metal, and the chemical element forming the infiltration auxiliary layer, the mean particle diameter of the diamond particles, etc.

Preferably, the semiconductor element mounting member of the present invention has a connecting layer that is made of solder containing at least one kind of metal selected from the group consisting of In, Sn, Ag, Au, Ge, Si, and Al and that is formed on the element mounting surface.

Accordingly, the semiconductor element mounting member and the semiconductor element are connected together in a state of closely adhering thereto through the connecting layer, and heat generated during the operation of the semiconductor element can be promptly removed.

Therefore, the semiconductor element can be even more reliably prevented from making a malfunction caused by heat, or from lowering its operation efficiency and its lifetime, or from being damaged.

Preferably, the solder forming the connecting layer is lead-free solder that contains any one of the above-mentioned metals and that does not contain lead, and the solder has a melting point of 270° C. or more to meet the high output capability of the semiconductor element, and, preferably, the solder is made of especially an alloy of Au and Sn or an alloy of Au and Ge.

The thickness of the connecting layer is preferably 1 μm or more, especially 3 μm or more, and is preferably 15 μm or less, especially 7 μm or less.

If the thickness thereof is less than the above-mentioned range, the amount of the solder interposed between the element mounting surface and the semiconductor element will become insufficient. Therefore, there is a fear that the semiconductor element cannot be fixed onto the element mounting surface in a state of adhering thereto without causing gaps or the like, and heat generated during the operation of the semiconductor element cannot be promptly removed by the semiconductor element mounting member.

If the thickness thereof exceeds the above-mentioned range, a large amount of solder will lie between the element mounting surface and the semiconductor element as a thermal resistance, and therefore, disadvantageously, there is a fear that heat generated during the operation of the semiconductor element cannot be promptly removed by the semiconductor element mounting member.

As a method of forming the connecting layer, it is recommended to select any one of or combine two or more of, for example, a vacuum deposition method, a sputtering method, an ion plating method, a plating method, and a preform (foil) welding method.

Preferably, the vacuum deposition method, the sputtering method, or the ion plating method is employed in consideration of especially forming a connecting layer excellent in thickness homogeneity and in composition homogeneity.

The connecting layer may be formed by piling up two or more layers made of solder that are different from each other in composition.

Preferably, an adhesion layer made of at least one kind of metal selected from the group consisting of Ni, Au, Ti, and Cr or made of a compound of these metals is interposed between the element mounting surface and the connecting layer.

The interposition of the adhesion layer makes it possible to heighten the adhesiveness between the semiconductor element mounting member and the connecting layer and to heighten the connecting strength of the semiconductor element.

The thickness of the adhesion layer is preferably 0.01 µm or more, and is preferably 5 µm or less.

If the thickness thereof is less than the above-mentioned range, there is a fear that the effect of heightening the adhesiveness of the connecting layer with respect to the semiconductor element mounting member, which is obtained by disposing the adhesion layer, cannot be obtained sufficiently.

On the other hand, if the thickness thereof exceeds the above-mentioned range, there is a fear that the effect of heightening the adhesiveness of the connecting layer obtained by the adhesion layer will be disadvantageously lowered. In addition, there is a fear that the adhesion layer will serve as a thermal resistance, and therefore heat generated during the operation of the semiconductor element cannot be promptly removed by the semiconductor element mounting member.

In order to form the adhesion layer, it is recommended to employ, for example, the vacuum deposition method, the sputtering method, the ion plating method, or the plating method.

Preferably, a monolayered or multilayered diffusion-preventing layer made of at least one kind of metal selected from the group consisting of Pt, Mo, and Pd or made of a compound of these metals is interposed between the adhesion layer and the connecting layer.

The interposition of the diffusion preventing layer makes it possible to prevent the composition of the connecting layer from being changed in quality by the diffusion of the metal from the adhesion layer when the connecting layer is melted by heat generated when the semiconductor element is mounted on the element mounting surface.

The thickness of the diffusion preventing layer is preferably 0.01 µm or more, and is preferably 1 µm or less.

If the thickness thereof is less than the above-mentioned range, there is a fear that the diffusion preventing effect obtained by disposing the diffusion preventing layer cannot be obtained sufficiently.

If the thickness thereof exceeds the above-mentioned range, there is likewise a fear that costs for the semiconductor element will rise in addition to the fact that a greater effect than the above one cannot be obtained.

In order to form the diffusion preventing layer, it is recommended to employ, for example, the vacuum deposition method, the sputtering method, the ion plating method, or the plating method.

Other conventionally well-known, various structures for mounting the semiconductor element, as well as a structure that has the above-described connecting layer used as an interposed layer, can be employed as a structure in which the semiconductor element is mounted on the element mounting surface of the semiconductor element mounting member of the present invention.

For example, a structure in which a semiconductor element is mounted directly on an adhesion layer that is made of at least one kind of metal selected from the group consisting of Ni, Au, Ti, and Cr or made of a compound of these metals and that is formed on an element mounting surface or in which a semiconductor element is mounted on an Au layer formed thereon through an Au bump can be mentioned as such another structure.

<Semiconductor Device>

The semiconductor device of the present invention is characterized in that a connecting layer made of solder containing at least one kind of metal selected from the group consisting of In, Sn, Ag, Au, Ge, Si, and Al is formed on the element mounting surface of the semiconductor element mounting member of the present invention, and the semiconductor element is mounted thereon through the connecting layer.

According to the semiconductor device of the present invention, the semiconductor element mounting member and the semiconductor element can be connected together in a state of closely adhering thereto through the connecting layer. Therefore, heat generated during the operation of the semiconductor element can be promptly removed, and the semiconductor element can be reliably prevented from making a malfunction caused by heat, or from lowering its operation efficiency and its lifetime, or from being damaged.

Preferably, an adhesion layer made of at least one kind of metal selected from the group consisting of Ni, Au, Ti, and Cr or made of a compound of these metals is interposed between the element mounting surface and the connecting layer.

The interposition of the adhesion layer makes it possible to heighten the adhesiveness between the semiconductor element mounting member and the connecting layer and to heighten the connecting strength of the semiconductor element.

Preferably, a monolayered or multilayered diffusion-preventing layer made of at least one kind of metal selected from the group consisting of Pt, Mo, and Pd or made of a compound of these metals is interposed between the adhesion layer and the connecting layer.

The interposition of the diffusion preventing layer makes it possible to prevent the composition of the connecting layer from being changed in quality by the diffusion of the metal from the adhesion layer when the connecting layer is melted by heat generated when the semiconductor element is mounted on the element mounting surface.

The composition, the thickness, the formation method, etc., of each of the connecting layer, the adhesion layer, and the diffusion preventing layer are as described above.

<Production Method of Semiconductor Element Mounting Member>

The production method of the present invention to produce the semiconductor element mounting member of the present invention is characterized by including the following steps (1) to (4), i.e., (1) a step of mixing many diamond particles out of which a porous body is made with at least either one selected from the group consisting of (1-1) and (1-2), i.e., (1-1) a powder of at least one kind of chemical element selected from the group consisting of Cr, W, Mo, Si, Ti, and Ni, and a powder of ammonium halide, and (1-2) a powder of halide of at least one kind of chemical element selected from the group consisting of Cr, W, Mo, Si, Ti, and Ni, and then preparing a resulting mixture, (2) a step of compressing and molding the mixture and producing a compression-molded compact, (3) a step of heating the compression-molded compact to 900° C. or more in a non-oxidizing atmosphere, then sintering the many diamond particles in a state of being in direct contact with each other, and forming an infiltration auxiliary layer made of the chemical element on an exposed surface of each diamond particle, and (4) a step of infiltrating a matrix metal into the porous body.

The mean particle diameter of the diamond particles used at the step (1) is preferably 1 μm or more, especially 10 μm or more, and is preferably 200 μm or less, especially 50 μm or less. The reason is as described above.

Of the two kinds of powders of (1-1) at which the powder is mixed with the diamond particles, the mean particle diameter of a powder of the chemical element out of which the infiltration auxiliary layer is made is preferably 1 μm or more, and is preferably 100 μm or less.

It is not easy to form the chemical element into a fine powder whose mean particle diameter is less than 1 μm, and production costs become high. Additionally, it is not easy to evenly mix the fine powder with diamond particles each of which has a predetermined mean particle diameter and with a powder of ammonium halide.

On the other hand, it is not easy to evenly mix a large-sized powder whose mean particle diameter exceeds 100 μm with the diamond particles each of which has the predetermined mean particle diameter and with the powder of ammonium halide.

The mean particle diameter of the powder of ammonium halide is preferably 1 μm or more, and is preferably 400 μm or less.

It is not easy to form ammonium halide into a fine powder whose mean particle diameter is less than 1 μm, and production costs become high. Additionally, it is not easy to evenly mix the fine powder with diamond particles each of which has a predetermined mean particle diameter and with a powder of the chemical element.

On the other hand, it is difficult to allow an ammonium halide powder whose mean particle diameter exceeds 400 μm to evenly react with the chemical element powder at the step (3), and therefore there is a fear that the thickness of the infiltration auxiliary layer formed through the step (3) will become nonuniform depending on places.

The mean particle diameter of the halide powder of (1-2) at which it is mixed with the diamond particles is preferably 1 μm or more, and is preferably 100 μm or less.

It is not easy to form the halide into a fine powder whose mean particle diameter is less than 1 μm, and production costs become high. Additionally, it is not easy to evenly mix the fine powder with diamond particles each of which has a predetermined mean particle diameter.

On the other hand, it is not easy to evenly mix a large-sized powder whose mean particle diameter exceeds 100 μm with diamond particles each of which has the predetermined mean particle diameter.

The content percentage of a chemical element out of which the infiltration auxiliary layer is made is preferably 0.1 volume % or more of the total amount of the chemical element and the diamond particles, and is preferably 20 volume % or less, especially 7 volume % or less. The reason is also as described above.

In order to adjust the content percentage, it is recommended to appropriately change the mixing ratio of the chemical element powder and/or the halide powder of the chemical element with respect to the diamond particles in the mixture.

Preferably, the mixing ratio between the chemical element M and the halogen X contained in the mixture is 1/2 or less that is expressed as the atomic ratio M/X.

If the halogen is smaller than the above-mentioned range, it is vaporized as a halide $MX_n$ during heating at the step (3), and is then deposited by cooling so that the amount of the chemical element M forming the infiltration auxiliary layer becomes insufficient, and unevenness tends to occur in the thickness of the infiltration auxiliary layer formed on the surface.

Therefore, bubbles tend to be generated when the melt of the matrix metal is infiltrated into the porous body, and there is a fear that the thermal conductivity of the diamond-metal complex and hence the thermal conductivity of the semiconductor element mounting member will become low.

On the other hand, if the atomic ratio M/X is set to be 1/2 or less, the infiltration auxiliary layer can be formed to have a uniform thickness without unevenness.

Therefore, the melt of the matrix metal can be evenly infiltrated into the porous body without generating bubbles or the like, and the thermal conductivity of the diamond-metal complex and hence the thermal conductivity of the semiconductor element mounting member can be further raised.

Preferably, the atomic ratio M/X is 1/7 or more.

Even if the halogen is greater than the above-mentioned range, the effect of forming the infiltration auxiliary layer by halogenating the chemical element M at the step (3), by then vaporizing it, and by precipitating it is not affected.

However, the percentage of the diamond particles is relatively reduced in proportion to a rise in the percentage of an ammonium halide with respect to the total amount of the mixture out of which the diamond-metal complex is made. Therefore, there is a fear that the thermal conductivity of the diamond-metal complex, which is formed by infiltrating the matrix metal into the porous body made of the diamond particles, and hence the thermal conductivity of the semiconductor element mounting member will be reduced.

Additionally, the thermal expansion coefficient of the diamond-metal complex tends to become higher in proportion to a fall in the percentage of the diamond particles and in proportion to a rise in the percentage of the matrix metal. Therefore, there is a fear that a difference in the thermal expansion coefficient between the semiconductor element mounting member made of the diamond-metal complex and the semiconductor element will be increased, and matchability will be decreased.

Preferably, the atomic ratio M/X is 1/5.5 or more in the above-mentioned range in consideration of further heightening the thermal conductivity of the diamond-metal complex and hence the thermal conductivity of the semiconductor element mounting member while maintaining the thermal expansion coefficient within the suitable range described above and while securing excellent matchability with the semiconductor element.

In order to adjust the atomic ratio M/X, it is recommended to appropriately change the mixing ratio of the chemical element powder, the ammonium halide powder, and the halide powder in the mixture.

For example, if the mixture contains the diamond particles and the two kinds of powders of (1-1), it is recommended to appropriately change the mixing ratio of the two kinds of powders of (1-1) in order to adjust the atomic ratio M/X. The same applies to an example in which the mixture further contains the halide of (1-2).

On the other hand, if the mixture contains the diamond particles and the halide of (1-2), it is recommended, for example, to appropriately select a 2-halide or a 3-halide as the halide, or to use two or more kinds of halides together, or to auxiliarily add an ammonium halide powder in order to adjust the atomic ratio M/X.

A compression molding condition when the mixture containing each element mentioned above is compressed and molded at the step (2) can be appropriately changed in accordance with the thickness of the infiltration auxiliary layer or the porosity rate of the porous body described above.

However, if the compression molding pressure is less than 200 MPa, a percentage at which many diamond particles come into direct contact with each other will be lowered in a compression-molded compact to be formed and in a porous body to be formed at the next step. Therefore, there is a fear that the thermal conductivity of the diamond-metal complex and hence the thermal conductivity of the semiconductor element mounting member will become low.

Preferably, the compression molding pressure is 200 MPa or more in consideration of heightening the percentage at which many diamond particles come into direct contact with each other and improving the thermal conductivity of the diamond-metal complex and the thermal conductivity of the semiconductor element mounting member.

However, even if the compression molding pressure exceeds 600 MPa, a more advantageous effect than that cannot be obtained, and, without being limited to this, the problem of increasing consumption energy during the compression molding process will occur. Therefore, preferably, the compression molding pressure is 600 MPa or less.

The step (3) is performed in a non-oxidizing atmosphere, or in a reducing atmosphere of, for example, hydrogen, or in an inert atmosphere of, for example, argon or nitrogen. As a result, the diamond particles are prevented from being oxidized, and the infiltration auxiliary layer is prevented from undergoing a functional decline caused by the oxidation of a chemical element forming the infiltration auxiliary layer, and therefore the thermal conductivity of the diamond-metal complex and hence the thermal conductivity of the semiconductor element mounting member can be improved.

As described above, preferably, the heating temperature is 900° C. or more. Preferably, the heating time is 0.5 hours or more.

If the heating temperature is less than 900° C. or if the heating time is less than 0.5 hours, the reaction to halogenate the chemical element M expressed by Formula (a) mentioned above cannot proceed excellently, and therefore there is a fear that the infiltration auxiliary layer that is excellently continuous cannot be formed on the exposed surface of each diamond particle making up the porous body.

Therefore, bubbles tend to be generated when the melt of the matrix metal is infiltrated into the porous body, and there is a fear that the thermal conductivity of the diamond-metal complex and hence the thermal conductivity of the semiconductor element mounting member will become low.

Preferably, the heating temperature is 1300° C. or less, and the heating time is 2 hours or less.

If the heating temperature exceeds 1300° C. or if the heating time exceeds 2 hours, the graphitization of the diamond particles proceeds, and there is a fear that the thermal conductivity of the diamond-metal complex and hence the thermal conductivity of the semiconductor element mounting member will become low.

The cooling condition after being heated can be arbitrarily set.

The infiltration step (4) can be performed in the same way as in the conventional technique.

For example, a plate material or the like of a matrix metal to be infiltrated is mounted on a porous body formed at the step (3), thereafter the matrix metal is melted by being heated in such a way as to exceed its melting point, and a melt that has been generated is infiltrated into pores of the porous body placed therebelow by its own weight so that the pores are filled therewith, and is cooled, thus forming a diamond-metal complex.

Preferably, this step is performed in a non-oxidizing atmosphere, or in a reducing atmosphere of, for example, hydrogen, or in an inert atmosphere of, for example, argon or nitrogen. As a result, the diamond particles or the matrix metal can be prevented from being oxidized, and the infiltration auxiliary layer can be prevented from undergoing a functional decline caused by the oxidation of a chemical element forming the infiltration auxiliary layer, and therefore the thermal conductivity of the diamond-metal complex and hence the thermal conductivity of the semiconductor element mounting member can be improved.

For example, if the matrix metal is Cu, the heating temperature is preferably 1100° C. or more, and is preferably 1300° C. or less although it is recommended for the heating temperature to be higher than the melting point of the matrix metal as mentioned above. If the matrix metal is Ag, the heating temperature is preferably 980° C. or more, and is preferably 1180° C. or less. If the matrix metal is Al, the heating temperature is preferably 650° C. or more, and is preferably 880° C. or less.

In all of the metals, the heating time is preferably 0.5 hours or more, and is preferably 2 hours or less.

If the heating temperature or the heating time is less than the above-mentioned range, the melt of the matrix metal cannot be infiltrated smoothly and sufficiently into pores of the porous body, and bubbles tend to be easily generated, and therefore there is a fear that the thermal conductivity of the diamond-metal complex and hence the thermal conductivity of the semiconductor element mounting member will become low.

On the other hand, even if the heating temperature or the heating time exceeds the above-mentioned range, the effect of infiltrating the melt of the matrix metal thereinto smoothly and sufficiently cannot be improved more advantageously than that, and, without being limited to this, the problem of increasing the consumption energy of the infiltration step will occur. Besides, the graphitization of the diamond particles proceeds, and there is also a fear that the thermal conductivity of the diamond-metal complex and hence the thermal conductivity of the semiconductor element mounting member will become low.

Of the matrix metals, oxygen-free copper, tough pitch copper, phosphorous-deoxidized copper, etc., can be used as Cu.

For example, if the matrix metal is Cu, the formation of a porous body of the step (3) and the infiltration of the step (4) can be performed continuously in the same atmosphere.

In detail, in a state in which a Cu plate or the like is mounted on a compression-molded compact obtained at the step (2), it is put into a non-oxidizing atmosphere, and is first heated at a temperature of 900° C. or more and at a temperature lower than the melting point of Cu, so that a porous body is formed, and an infiltration auxiliary layer is selectively formed on the exposed surface of each diamond particle making up the porous body.

Thereafter, Cu is melted at a heating temperature greater than the melting point of Cu, preferably at a temperature of 1100° C. or more, and a melt that has been generated is infiltrated into pores of the porous body placed therebelow by its own weight so that the pores are filled therewith, and is cooled, thus forming a diamond-metal complex.

Each processing time is preferably 0.5 hours or more, and is preferably 2 hours or less. The reason is as described above.

Excess Cu that remains on the surface of the formed diamond-metal complex is removed by machine grinding, and electric discharge machining and machine grinding, etc., are performed if needed, and, as a result, it is possible to produce a semiconductor element mounting member that has a predetermined three-dimensional shape and that has been finished up so that the element mounting surface or the connection surface with other members has the above-mentioned surface roughness.

EXAMPLES

Example 1

Diamond particles whose mean particle diameter was 20 μm, a Cr powder whose mean particle diameter was 45 μm, and an ammonium chloride powder whose mean particle diameter was 100 μm were compounded together, and were mixed together by use of a stirrer, and, as a result, a mixture was prepared.

The volume ratio between the diamond particles and the Cr powder was 95:5. The content percentage of Cr was 5 volume % of the total amount of Cr and the diamond particles.

The mixing ratio between the Cr powder and the ammonium-chloride powder was 1/2.7 that was expressed as the atomic ratio M/X.

The mixture was compressed and molded under a pressure of 400 MPa by mold pressing, and a rectangular parallelepiped 15 mm×15 mm×3 mm compression-molded compact was produced.

The produced compression-molded compact was heated under the condition of 1000° C.×2-hours in a hydrogen atmosphere, and then was cooled, and, as a result, the many diamond particles were sintered in a state of being in direct contact with each other according to the mechanism described above, and an infiltration auxiliary layer made of Cr was formed on an exposed surface of each of the diamond particles.

The external dimensions of the formed porous body were measured to find its volume $V_T$, and the mass $M_T$ of the porous body was measured, and, from the mass $M_T$ and the volume $V_T$, the apparent density $\rho_T$ of the porous body was found according to Formula (C):

$$\rho_T = M_T/V_T \quad (c)$$

and the result was 2.33 g/cm³.

An oxygen-free Cu plate large enough to fill pores in the porous body therewith was mounted on the porous body, and Cu that had been melted on the condition of 1250° C.×1-hour in a hydrogen atmosphere was infiltrated into the porous body, and then was cooled.

Excess Cu that remained on the surface after the end of cooling was removed by machine grinding, and a diamond-Cu complex serving as a precursor of the semiconductor element mounting member was obtained.

Examples 2 to 7

A diamond-Cu complex serving as a precursor of the semiconductor element mounting member was obtained in the same way as in Example 1 except for the fact that the volume ratio between the diamond particles and the Cr powder was adjusted so that the content percentage of Cr was 0.11 volume % (Example 2), 1.25 volume % (Example 3), 5.5 volume % (Example 4), 7 volume % (Example 5), 16 volume % (Example 6), and 21 volume % (Example 7) of the total amount of Cr and the diamond particles.

The mixing ratio of the ammonium chloride powder was adjusted so that the atomic ratio M/X maintained 1/2.7.

Examples 8 and 9

A diamond-Cu complex serving as a precursor of the semiconductor element mounting member was obtained in the same way as in Example 1 except for the fact that the mixing ratio of the ammonium chloride powder was adjusted so that the atomic ratio M/X was 1/1.7 (Example 8) and 1/2.1 (Example 9).

The volume ratio between the diamond particles and the Cr powder was set to be 95:5. The content percentage of Cr was 5 volume % of the total amount of Cr and the diamond particles.

In Example 8, unevenness occurred in the infiltration auxiliary layer, and therefore many bubbles were observed after the infiltration of Cu.

Examples 10 to 14

A diamond-Cu complex serving as a precursor of the semiconductor element mounting member was obtained in the same way as in Example 1 except for the fact that diamond particles having a mean particle diameter of 0.6 μm (Example 10), 3 μm (Example 11), 11 μm (Example 12), 48 μm (Example 13), and 193 μm (Example 14) were used as the diamond particles.

The volume ratio between the diamond particles and the Cr powder was set to be 95:5. The content percentage of Cr was 5 volume % of the total amount of Cr and the diamond particles.

Additionally, the mixing ratio between the Cr powder and the ammonium-chloride powder was 1/2.7 that was expressed as the atomic ratio M/X.

In Example 14, a major defect that was caused by the drop-off of diamond particles during grinding was observed.

Example 15

Diamond particles whose mean particle diameter was 45 μm, a Cr powder whose mean particle diameter was 45 μm, and an ammonium chloride powder whose mean particle diameter was 100 μm were compounded together, and were mixed together by use of a stirrer, and, as a result, a mixture was prepared.

The volume ratio between the diamond particles and the Cr powder was set to be 98.75:1.25. The content percentage of Cr was 1.25 volume % of the total amount of Cr and the diamond particles.

Additionally, the mixing ratio between the Cr powder and the ammonium chloride powder was 1/2.3 that was expressed as the atomic ratio M/X.

The mixture was compressed and molded under a pressure of 210 MPa by mold pressing, and a rectangular parallelepiped 15 mm×15 mm×3 mm compression-molded compact was produced.

The produced compression-molded compact was heated under the condition of 1000° C.×2-hours in a hydrogen atmosphere, and then was cooled, and, as a result, the many diamond particles were sintered in a state of being in direct contact with each other according to the mechanism described above, and an infiltration auxiliary layer made of Cr was formed on an exposed surface of each of the diamond particles.

An oxygen-free Cu plate large enough to fill pores in the porous body therewith was mounted on the porous body, and Cu that had been melted on the condition of 1250° C.×1-hour in a hydrogen atmosphere was infiltrated into the porous body, and then was cooled.

Excess Cu that remained on the surface after the end of cooling was removed by machine grinding, and a diamond-Cu complex serving as a precursor of the semiconductor element mounting member was obtained.

In the diamond-Cu complex, the amount of Cu was small, and many bubbles were observed.

Examples 16 to 19

A diamond-Cu complex serving as a precursor of the semiconductor element mounting member was obtained in the same way as in Example 15 except for the fact that the mixing ratio of the ammonium chloride powder was adjusted so that the atomic ratio M/X was 1/2.8 (Example 16), 1/4.3 (Example 17), 1/5.5 (Example 18), and 1/6.9 (Example 19).

The volume ratio between the diamond particles and the Cr powder was set to be 98.75:1.25. The content percentage of Cr was 1.25 volume % of the total amount of Cr and the diamond particles.

Examples 20 to 24

A diamond-Cu complex serving as a precursor of the semiconductor element mounting member was obtained in the same way as in Example 1 except for the fact that W powder (Example 20), Mo powder (Example 21), Si powder (Example 22), Ni powder (Example 23), and Ti powder (Example 24) each of which had a mean particle diameter of 45 µm were used as the powder of a chemical element out of which the infiltration auxiliary layer is made.

The volume ratio between the diamond particles and the powder of each chemical element was set to be 95:5. The content percentage of each chemical element was 5 volume % of the total amount of each chemical element and the diamond particles.

Additionally, the mixing ratio between the powder of each chemical element and the ammonium chloride powder was 1/2.7 that was expressed as the atomic ratio M/X.

Example 25

A diamond-Al complex serving as a precursor of the semiconductor element mounting member was obtained in the same way as in Example 1 except for the fact that a Si powder whose mean particle diameter was 45 µm was used as the powder of a chemical element out of which the infiltration auxiliary layer is made, Al was used as a matrix metal, and Al was infiltrated into the porous body at an infiltration temperature of 800° C.

The volume ratio between the diamond particles and the Si powder was set to be 95:5. The content percentage of Si was 5 volume % of the total amount of Si and the diamond particles.

Additionally, the mixing ratio between the Si powder and the ammonium chloride powder was 1/2.7 that was expressed as the atomic ratio M/X.

Example 26

A diamond-Ag complex serving as a precursor of the semiconductor element mounting member was obtained in the same way as in Example 1 except for the fact that a Ni powder whose mean particle diameter was 45 µm was used as the powder of a chemical element out of which the infiltration auxiliary layer is made, and Ag was used as a matrix metal.

The volume ratio between the diamond particles and the Ni powder was set to be 95:5. The content percentage of Ni was 5 volume % of the total amount of Ni and the diamond particles.

The mixing ratio between the Ni powder and the ammonium chloride powder was 1/2.7 that was expressed as the atomic ratio M/X.

Conventional Example 1

A carbon case had a concave having a rectangular 15 mm×15 mm planar bottom surface, and the inside of the concave was filled with diamond particles. The diamond particles were then compressed and molded under a pressure of 400 MPa by mold pressing, and a rectangular parallelepiped 15 mm×15 mm×3 mm compression-molded compact was produced.

An oxygen-free Cu plate large enough to fill pores in the compression-molded compact therewith was mounted on the compression-molded compact, and Cu that had been melted on the condition of 1250° C.×1-hour in a hydrogen atmosphere was infiltrated into the porous body, and then was cooled.

It was taken out of the carbon case after the end of cooling, and excess Cu that remained on the surface was removed by machine grinding, and a diamond-Cu complex serving as a precursor of the semiconductor element mounting member was obtained.

Conventional Example 2

The whole of the surface of each diamond particle having a mean particle diameter of 20 µm was beforehand covered with Cr serving as an infiltration auxiliary layer according to the sputtering method.

The diamond particles were compressed and molded under a pressure of 400 MPa by mold pressing, and a rectangular parallelepiped 15 mm×15 mm×3 mm compression-molded compact was produced.

The compression-molded compact was heated under the condition of 1000° C.×2-hours in a hydrogen atmosphere, and a porous body in which many diamond particles had been sintered in a state of being in contact with each other through the infiltration auxiliary layer was obtained.

A diamond-Cu complex serving as a precursor of the semiconductor element mounting member was obtained in the same way as in Example 1 except for the fact that the thus formed porous body was used.

Conventional Example 3

The whole of the surface of each diamond particle having a mean particle diameter of 20 μm was beforehand covered with Ti serving as an infiltration auxiliary layer according to the sputtering method.

The diamond particles were compressed and molded under a pressure of 400 MPa by mold pressing, and a rectangular parallelepiped 15 mm×15 mm×3 mm compression-molded compact was produced.

The compression-molded compact was heated under the condition of 1000° C.×2-hours in a hydrogen atmosphere, and a porous body in which many diamond particles had been sintered in a state of being in contact with each other through the infiltration auxiliary layer was obtained.

A diamond-Cu complex serving as a precursor of the semiconductor element mounting member was obtained in the same way as in Example 1 except for the fact that the thus formed porous body was used.

<Measurement of Thickness of Infiltration Auxiliary Layer>

In the examples and the conventional examples described above, the porous body into which the matrix metal had not yet been infiltrated was fractured, and a fracture surface was photographed by use of a scanning electron microscope, and a resulting photograph was subjected to image processing so as to find the thickness of the infiltration auxiliary layer.

<Measurement of Content Percentage of Matrix Metal>

The external dimensions of the porous body into which a matrix metal had not yet been infiltrated, was measured to find its volume $V_T$, and the mass $M_T$ of the porous body was measured, and, from the mass $M_T$ and the volume $V_T$, the apparent density $\rho_T$ of the porous body into which a matrix metal had not yet been infiltrated was found according to Formula (c) as described above.

Furthermore, a matrix metal was infiltrated into the porous body, and the external dimensions of a diamond-metal complex that was obtained by removing an excess matrix metal remaining on the surface by machine grinding were measured to find the volume $V_F$, and the mass $M_F$ of the diamond-metal complex was measured.

From the volume $V_F$, the mass $M_F$, and the previously-found apparent density $\rho_T$, the mass $M_M$ of the matrix metal contained in the diamond-metal complex was found according to Formula (d):

$$M_M = M_F - (V_F \times \rho_T) \quad \text{(d)}$$

Furthermore, from the mass $M_M$ and the specific gravity $\rho_M$ of the matrix metal, the volume $V_M$ of the matrix metal contained in the diamond-metal complex was found according to Formula (e):

$$V_M = M_M/\rho_M \quad \text{(e)}$$

Furthermore, from the volume $V_M$ of the matrix metal and the volume $V_F$ of the diamond-metal complex, the content percentage $R_V$ (volume %) of the matrix metal of the total amount of the diamond-metal complex was found according to Formula (f):

$$R_V = (V_M/V_F) \times 100 \quad \text{(f)}$$

<Measurement of Thermal Conductivity>

The thermal conductivity of the diamond-metal complex obtained by the examples and by the conventional examples was found according to the laser flash method.

First, a diameter 10φ×thickness 2 mm disk-shaped sample was produced from the diamond-metal complex.

The sample was mounted on a sample table in a state in which the rear surface of the sample faced downwardly, and thermal energy was given by radiating a laser beam onto the front surface thereof at room temperature (23±1° C.) in the atmosphere, and, simultaneously, a change in the temperature of the rear surface thereof was measured by an infrared detector so as to find the thermal diffusivity α.

Furthermore, from the previously-measured volume $V_F$ and mass $M_F$ of the diamond-metal complex, the density $\rho_F$ of the diamond-metal complex was found according to Formula (g):

$$\rho_F = M_F/V_F \quad \text{(g)}$$

Furthermore, from the thermal diffusivity α, the density $\rho_F$, and the specific heat Cp, the thermal conductivity λ was found according to Formula (h):

$$\lambda = Cp \times \alpha \times \rho_F \quad \text{(h)}$$

<Measurement of Thermal Expansion Coefficient>

The thermal expansion coefficient of the diamond-metal complex obtained by the examples and by the conventional examples was found according to the differential expansion measuring method.

First, a length 2 mm×width 2 mm×height 10 mm prism-shaped sample was produced from the diamond-metal complex.

The prism-shaped sample and a reference substance (made of quartz) having the same size were simultaneously heated in a state of being placed at the lower end of a detection rod provided with a displacement sensor so as to find a difference in thermal expansion (differential thermal expansion), and the thermal expansion coefficient was found from the result.

The thus obtained results are shown in Table 1 to Table 3.

TABLE 1

| | Diamond particles | Molding pressure | Chemical element M | | | Infiltration auxiliary layer | Matrix metal | | Infiltration temperature | Thermal conductivity | Thermal expansion coefficient |
|---|---|---|---|---|---|---|---|---|---|---|---|
| | | | Kind | Volume % | M/X | | Kind | Volume % | | | |
| | μm | MPa | | | | μm | | | °C. | W/m·K | ×10$^{-6}$/K |
| Example 2 | 20 | 400 | Cr | 0.11 | 1/2.7 | 0.02 | Cu | 38.6 | 1250 | 429 | 7.5 |
| Example 3 | 20 | 400 | Cr | 1.25 | 1/2.7 | 0.54 | Cu | 37.8 | 1250 | 384 | 7.4 |
| Example 1 | 20 | 400 | Cr | 5 | 1/2.7 | 1.05 | Cu | 35.4 | 1250 | 360 | 7.2 |
| Example 4 | 20 | 400 | Cr | 5.5 | 1/2.7 | 1.95 | Cu | 35.1 | 1250 | 345 | 7.0 |
| Example 5 | 20 | 400 | Cr | 7 | 1/2.7 | 2.45 | Cu | 34.1 | 1250 | 280 | 6.8 |
| Example 6 | 20 | 400 | Cr | 16 | 1/2.7 | 4.83 | Cu | 27.6 | 1250 | 163 | 5.5 |
| Example 7 | 20 | 400 | Cr | 21 | 1/2.7 | 5.46 | Cu | 25.1 | 1250 | 115 | 5.1 |
| Example 8 | 20 | 400 | Cr | 5 | 1/1.7 | 1.02 | Cu | 34.4 | 1250 | 176 | 6.9 |
| Example 9 | 20 | 400 | Cr | 5 | 1/2.1 | 1.02 | Cu | 34.4 | 1250 | 354 | 7.1 |

TABLE 2

| | Diamond particles μm | Molding pressure MPa | Chemical element M Kind | Chemical element M Volume % | Chemical element M M/X | Infiltration auxiliary layer μm | Matrix metal Kind | Matrix metal Volume % | Infiltration temperature °C. | Thermal conductivity W/m · K | Thermal expansion coefficient ×10⁻⁶/K |
|---|---|---|---|---|---|---|---|---|---|---|---|
| Example 10 | 0.6 | 400 | Cr | 5 | 1/2.7 | 0.03 | Cu | 35.2 | 1250 | 136 | 6.8 |
| Example 11 | 3 | 400 | Cr | 5 | 1/2.7 | 0.11 | Cu | 35.0 | 1250 | 224 | 7.1 |
| Example 12 | 11 | 400 | Cr | 5 | 1/2.7 | 0.52 | Cu | 35.2 | 1250 | 284 | 7.1 |
| Example 13 | 48 | 400 | Cr | 5 | 1/2.7 | 1.38 | Cu | 35.8 | 1250 | 535 | 7.4 |
| Example 14 | 193 | 400 | Cr | 5 | 1/2.7 | 4.25 | Cu | 35.5 | 1250 | 585 | 7.2 |
| Example 15 | 45 | 210 | Cr | 1.25 | 1/2.3 | 0.83 | Cu | 25.3 | 1250 | 220 | 4.9 |
| Example 16 | 45 | 210 | Cr | 1.25 | 1/2.8 | 0.91 | Cu | 30.4 | 1250 | 395 | 6.4 |
| Example 17 | 45 | 210 | Cr | 1.25 | 1/4.3 | 1.08 | Cu | 47.2 | 1250 | 354 | 7.8 |
| Example 18 | 45 | 210 | Cr | 1.25 | 1/5.5 | 1.36 | Cu | 59.7 | 1250 | 323 | 8.0 |
| Example 19 | 45 | 210 | Cr | 1.25 | 1/6.9 | 1.95 | Cu | 75.6 | 1250 | 235 | 9.6 |

TABLE 3

| | Diamond particles μm | Molding pressure MPa | Chemical element M Kind | Chemical element M Volume % | Chemical element M M/X | Infiltration auxiliary layer μm | Matrix metal Kind | Matrix metal Volume % | Infiltration temperature °C. | Thermal conductivity W/m · K | Thermal expansion coefficient ×10⁻⁶/K |
|---|---|---|---|---|---|---|---|---|---|---|---|
| Example 20 | 20 | 400 | W | 5 | 1/2.7 | 1.03 | Cu | 35.3 | 1250 | 389 | 7.6 |
| Example 21 | 20 | 400 | Mo | 5 | 1/2.7 | 0.99 | Cu | 34.5 | 1250 | 345 | 7.3 |
| Example 22 | 20 | 400 | Si | 5 | 1/2.7 | 1.05 | Cu | 36.2 | 1250 | 329 | 7.2 |
| Example 23 | 20 | 400 | Ni | 5 | 1/2.7 | 1.03 | Cu | 35.8 | 1250 | 312 | 7.6 |
| Example 24 | 20 | 400 | Ti | 5 | 1/2.7 | 1.01 | Cu | 35.5 | 1250 | 315 | 7.4 |
| Example 25 | 20 | 400 | Si | 5 | 1/2.7 | 0.95 | Al | 35.2 | 800 | 286 | 7.9 |
| Example 26 | 20 | 400 | Ni | 5 | 1/2.7 | 0.97 | Ag | 34.9 | 1100 | 389 | 7.3 |
| Conventional Example 1 | 20 | 400 | None | | | — | Cu | 35.4 | 1250 | 80 | 4.2 |
| Conventional Example 2 | 20 | 400 | Cr(*1) | | | 0.95 | Cu | 34.8 | 1250 | 198 | 6.9 |
| Conventional Example 3 | 20 | 400 | Ti(*2) | | | 1.01 | Cu | 35.1 | 1250 | 215 | 7.1 |

(*1)The whole of the surface of each diamond particle was beforehand covered with Cr according to the sputtering method so as to serve as an infiltration auxiliary layer.
(*2)The whole of the surface of each diamond particle was beforehand covered with Ti according to the sputtering method so as to serve as an infiltration auxiliary layer.

From the result of Conventional Example 1, it was understood that if the infiltration auxiliary layer is not disposed on the exposed surface of each diamond particle making up the porous body, the melt of the matrix metal cannot be evenly infiltrated into the porous body without gaps, and many bubbles will remain inside, and therefore, in spite of the fact that diamond particles are used for its formation, a thermal conductivity that meets it cannot be obtained.

Additionally, from the results of Conventional Examples 2 and 3, it was understood that, if an infiltration auxiliary layer is disposed on the surface of each diamond particle making up a porous body, the thermal conductivity can be improved by evenly infiltrating a melt of a matrix metal into the porous body without gaps, and yet, if the infiltration auxiliary layer is also interposed between the diamond particles, limitations will be imposed on the above-mentioned effect.

On the other hand, from the results of the examples, it was understood that a porous body is formed in a state in which diamond particles are in direct contact with each other, and an infiltration auxiliary layer is selectively disposed only on the exposed surface of each diamond particle making up the porous body, thus making it possible to realize a high thermal conductivity that meets the formation by use of diamond particles.

Additionally, from the results of Examples 1 to 7, it was understood that the content percentage of a chemical element that forms an infiltration auxiliary layer is preferably 0.1 volume % or more of the total amount of the chemical element and diamond particles, and is preferably 20 volume % or less, especially 7 volume % or less, and it was understood that the thickness of the infiltration auxiliary layer is preferably 0.01 μm or more, and is preferably 5 μm or less, especially 2.5 μm or less.

From the results of Examples 1, 8, and 9, it was understood that the atomic ratio M/X between a chemical element M and halogen X is preferably 1/2 or less. Additionally, from the results of Examples 15 to 19 of Table 2, it was understood that the atomic ratio M/X is preferably 1/7 or more, especially 1/5.5 or more in the above-mentioned range.

Additionally, from the results of Examples 15 to 19, it was understood that the content percentage of a matrix metal with respect to the total amount of a diamond-metal complex is preferably 20 volume % or more, especially 30 volume % or more, and is preferably 80 volume % or less, especially 60 volume % or less.

From the results of Example 1 and Examples 10 to 14, it was understood that the mean particle diameter of the diamond particles is preferably 1 μm or more, especially 10 μm or more, and is preferably 200 μm or less, especially 50 μm or less.

From the results of Examples 20 to 26, it was understood that chemical elements that form an infiltration auxiliary layer and matrix metals can be combined together in various manners.

The invention claimed is:

1. A semiconductor element mounting member having an element mounting surface on which a semiconductor element is to be mounted, consisting of a diamond-metal complex in which at least one kind of matrix metal selected from the group consisting of Cu, Ag, and Al is infiltrated into a porous body consisting of many diamond particles characterized in that
the porous body is formed by sintering the many diamond particles directly contacted each other, and an infiltration auxiliary layer made of at least one kind of chemical element selected from the group consisting of Cr, W, Mo, Si, Ti, and Ni is formed on an exposed surface of each of the many diamond particles.

2. The semiconductor element mounting member according to claim 1, wherein a thermal conductivity of the diamond-metal complex is 150 W/m·K or more.

3. The semiconductor element mounting member according to claim 1, wherein a thermal conductivity of the diamond-metal complex is 280 W/m·K or more.

4. The semiconductor element mounting member according to claim 1, wherein a mean diameter of the diamond particles is 1 μm or more.

5. The semiconductor element mounting member according to claim 1, wherein a thickness of the infiltration auxiliary layer is 5 μm or less.

6. The semiconductor element mounting member according to claim 1, wherein a content percentage of a chemical element forming the infiltration auxiliary layer is 20 volume % or less of a total amount of the chemical element and the diamond particles.

7. The semiconductor element mounting member according to claim 1, wherein a connecting layer made of solder containing at least one kind of metal selected from the group consisting of In, Sn, Ag, Au, Ge, Si, and Al is formed on the element mounting surface.

8. The semiconductor element mounting member according to claim 7, wherein an adhesion layer made of at least one kind of metal selected from the group consisting of Ni, Au, Ti, and Cr or made of a compound of these metals is interposed between the element mounting surface and the connecting layer.

9. The semiconductor element mounting member according to claim 8, wherein a diffusion preventing layer made of at least one kind of metal selected from the group consisting of Pt, Mo, and Pd or made of a compound of these metals is interposed between the adhesion layer and the connecting layer.

10. A method of producing the semiconductor element mounting member according to claim 1, the method comprising:
(1) a step of mixing many diamond particles out of which a porous body is made with at least either one selected from the group consisting of
(1-1) a powder of at least one kind of chemical element selected from the group consisting of Cr, W, Mo, Si, Ti, and Ni, and a powder of ammonium halide, and
(1-2) a powder of halide of at least one kind of chemical element selected from the group consisting of Cr, W, Mo, Si, Ti, and Ni, and
then preparing a resulting mixture;
(2) a step of compressing and molding the mixture and producing a compression-molded compact;
(3) a step of heating the compression-molded compact to 900° C. or more in a non-oxidizing atmosphere, then sintering the many diamond particles in a state of being in direct contact with each other, and forming an infiltration auxiliary layer made of the chemical element on an exposed surface of each diamond particle; and
(4) a step of infiltrating a matrix metal into the porous body.

11. The method of producing the semiconductor element mounting member according to claim 10, wherein a mixing ratio between the chemical element M and the halogen X at the step (1) is 1/2 or less that is expressed as an atomic ratio M/X.

12. A semiconductor device characterized in that
a connecting layer made of solder containing at least one kind of metal selected from the group consisting of In, Sn, Ag, Au, Ge, Si, and Al is formed on the element mounting surface of the semiconductor element mounting member according to claim 1, and
a semiconductor element is mounted on the element mounting surface with the connecting layer therebetween.

13. The semiconductor device according to claim 12, wherein an adhesion layer made of at least one kind of metal selected from the group consisting of Ni, Au, Ti, and Cr or made of a compound of these metals is interposed between the element mounting surface and the connecting layer.

14. The semiconductor device according to claim 13, wherein a diffusion preventing layer made of at least one kind of metal selected from the group consisting of Pt, Mo, and Pd or made of a compound of these metals is interposed between the adhesion layer and the connecting layer.

* * * * *

UNITED STATES PATENT AND TRADEMARK OFFICE
CERTIFICATE OF CORRECTION

| | | |
|---|---|---|
| PATENT NO. | : 8,575,625 B2 | |
| APPLICATION NO. | : 13/564426 | |
| DATED | : November 5, 2013 | |
| INVENTOR(S) | : Kouichi Takashima et al. | |

It is certified that error appears in the above-identified patent and that said Letters Patent is hereby corrected as shown below:

In the Claims:

Column 30, Claim 10:

In line 23, "900° C. or more in a non-oxidizing atmosphere, then" should read -- 900°C or more in a non-oxidizing atmosphere, then --.

Signed and Sealed this
Twenty-fifth Day of February, 2014

Michelle K. Lee
*Deputy Director of the United States Patent and Trademark Office*